United States Patent
Hart et al.

(10) Patent No.: US 7,768,364 B2
(45) Date of Patent: Aug. 3, 2010

(54) BULK ACOUSTIC RESONATORS WITH MULTI-LAYER ELECTRODES

(75) Inventors: David Hart, Cornelius, OR (US); Sudarsan Uppili, Portland, OR (US); Guillaume Bouche, Beaverton, OR (US)

(73) Assignee: Maxim Integrated Products, Inc., Sunnyvale, CA (US)

( * ) Notice: Subject to any disclaimer, the term of this patent is extended or adjusted under 35 U.S.C. 154(b) by 86 days.

(21) Appl. No.: 12/135,431

(22) Filed: Jun. 9, 2008

(65) Prior Publication Data

US 2009/0302973 A1 Dec. 10, 2009

(51) Int. Cl.
*H03H 9/215* (2006.01)
*H01L 41/047* (2006.01)

(52) U.S. Cl. .................................. 333/187; 310/364
(58) Field of Classification Search ................ 333/187, 333/188, 189, 191, 192; 310/364
See application file for complete search history.

(56) References Cited

U.S. PATENT DOCUMENTS

| | | | | |
|---|---|---|---|---|
| 5,325,012 | A * | 6/1994 | Sato et al. | 310/364 |
| 5,373,268 | A | 12/1994 | Dworsky et al. | |
| 6,060,818 | A | 5/2000 | Ruby et al. | |
| 6,239,536 | B1 | 5/2001 | Lakin | |
| 6,291,931 | B1 * | 9/2001 | Lakin | 310/364 |
| 6,577,043 | B2 | 6/2003 | Tsukai et al. | |
| 6,878,604 | B2 | 4/2005 | Aigner et al. | |
| 6,943,647 | B2 | 9/2005 | Aigner et al. | |
| 7,002,437 | B2 * | 2/2006 | Takeuchi et al. | 333/187 |
| 7,221,242 | B2 * | 5/2007 | Asai et al. | 333/187 |
| 7,463,117 | B2 * | 12/2008 | Ohara et al. | 333/187 |
| 7,554,426 | B2 * | 6/2009 | Lee et al. | 333/187 |
| 7,612,488 | B1 * | 11/2009 | Bouche et al. | 310/364 |
| 2002/0030420 | A1 | 3/2002 | Tsukai et al. | |
| 2002/0084873 | A1 | 7/2002 | Ella et al. | |
| 2003/0199105 | A1 | 10/2003 | Kub et al. | |
| 2004/0227591 | A1 | 11/2004 | Aigner et al. | |
| 2005/0073027 | A1 | 4/2005 | Irikura et al. | |
| 2005/0093157 | A1 | 5/2005 | Noguchi et al. | |
| 2006/0043507 | A1 | 3/2006 | Lobl et al. | |
| 2008/0042780 | A1 * | 2/2008 | Lee et al. | 333/187 |
| 2008/0150653 | A1 * | 6/2008 | Hara et al. | 333/187 |

FOREIGN PATENT DOCUMENTS

| | | |
|---|---|---|
| EP | 0 609 555 | 8/1994 |
| EP | 0 771 070 | 5/1997 |

(Continued)

OTHER PUBLICATIONS

"International Search Report and Written Opinion of the International Searching Authority Dated Nov. 14, 2008" International Application No. PCT/US2008/008527.

(Continued)

*Primary Examiner*—Dean O Takaoka
(74) *Attorney, Agent, or Firm*—Blakely Sokoloff Taylor & Zafman LLP

(57) ABSTRACT

Bulk acoustic resonators with multi-layer electrodes for Bulk Acoustic Wave (BAW) resonator devices. Various electrode combinations are disclosed. The invention provides a better compromise at resonant frequencies from 1800 MHz to 4 GHz in terms of keff2 and resistance than state of the art solutions using either Mo, or a bilayer of Al and W.

22 Claims, 6 Drawing Sheets

Aluminum may or may not be enclosed in between barrier layers like Ti, TiN, TaN
Bragg Mirror underneath is not represented for clarity
Eventual barrier films are not represented either

FOREIGN PATENT DOCUMENTS

| EP | 1 418 671 | 5/2004 |
|---|---|---|
| EP | 1 748 556 | 1/2007 |
| WO | WO-03/006701 | 1/2003 |
| WO | WO-2006/004470 | 1/2006 |
| WO | WO-2006/101450 | 9/2006 |
| WO | WO-2008/102358 | 8/2008 |

OTHER PUBLICATIONS

"International Search Report and Written Opinion of the International Searching Authority Dated Nov. 7, 2008", International Application No. PCT/US2008/007282.

"International Search Report and Written Opinion of the International Searching Authority Dated Sep. 8, 2008" International Application No. PCT/US2008/005628.

Aigner, R., et al., "Advancement of MEMS into RF-Filter Applications", *Proceedings of IEDM*, (2002), pp. 897-900.

Auner, G. W., et al., "Microstructure of low temperature grown AlN thin films on Si (111)", *Journal of Applied Physics*, vol. 85, No. 11, (Jun. 1, 1999), pp. 7879-7883.

Fattinger, G.G., et al., "Optimization of Acoustic Dispersion for High Performance Thin Film BAW Resonators", *IEEE Ultrasonics Symposium*, (2005), pp. 1175-1178.

Kaitila, J., et al., "Spurious Resonance Free Bulk Acoustic Wave Resonators", *IEEE Ultrasonics Symposium*, (2003), pp. 84-87.

Lakin, K.M., et al., "Stacked Crystal Filters Implemented with Thin Films" *43rd Annual Symposium on Frequency Control*, (1989), pp. 536-543.

Loebl, H. P., et al., "Low-Level Effects in SBARS and Their Application to Device Optimisation", *IEEE Ultrasonics Symposium*, (2003), pp. 182-186.

Loebl, H. P., et al., "RF Bulk Acoustic Wave Resonators and Filters", *Journal of Electroceramics*, No. 12, (2004), pp. 109-118.

Newell, W.E., "Face-Mounted Piezoelectric Resonators" *Proceedings of the IEEE*, (1965), pp. 575-581.

Park, Jae Y., et al., "Micromachined FBAR RF Filters for Advanced Handset Applications", *12th International Conference on Solid State Sensors, Actuators and Microsystems*, (2003), pp. 911-914.

Pensala, Tuomas, et al., "Spurious resonance suppression in ZnO based thin-film BAW resonators: FEM modeling and experiment", *IEEE Ultrasonics Symposium*, (2005), pp. 1844-1847.

Schmidhammer, Edgar, et al., "High Volume Production of a fully matched 5050 PCS-CDMA-BAW Duplexer", *IEEE Ultrasonics Symposium*, (2006), pp. 329-332.

Ueda, Masanori, et al., "High-Q Resonators using FBAR/SAW Technology and their Applications", *IEEE*, (2005), 4 pgs.

\* cited by examiner

Aluminum may or may not be enclosed in between barrier layers like Ti, TiN, TaN
Bragg Mirror underneath is not represented for clarity
Eventual barrier films are not represented either

BULK ACOUSTIC RESONATORS WITH MULTI-LAYER ELECTRODES

BACKGROUND OF THE INVENTION

1. Field of the Invention

The present invention relates to the field of bulk acoustic resonators.

2. Prior Art

Bulk acoustic wave (BAW) resonators are used to provide RF filtering for wireless application, and may also be used in reference oscillators. However, the cost and performance of a BAW resonator is quite dependent on the electrodes used. The problem for BAW resonator electrodes is to combine a set of requirements that can appear at times non-compatible. A BAW resonator electrode should have:

- low resistance to limit insertion losses
- high acoustic impedance to confine the energy within the active stack of the device and achieve good keff2
- allow for a good growth of highly oriented polycrystalline AlN in the case of the bottom electrode
- be fully integrable, that is, allow for a realistic manufacturability with good etch selectivity in the process.

The resulting stack making up the BAW resonator, including these electrodes, needs to show a Thickness Extensional mode branch in the dispersion curves plot (whose domain is wave number in abscissa, frequency in ordinate) favorable for spurious mode control (usually targeted with a positive slope, but qualitatively flat).

U.S. Pat. No. 6,291,931 discloses the use of a layer of W and a layer of Al for BAW resonator electrodes. However it has been found that tetra-methyl-ammonium-hydroxide (TMAH), particularly heated and used in a wet immersion etch, is a superior etching process for AlN. However in cases where the W layer is porous, which it may be, the TMAH etches the Al layer, which in the case of the bottom electrode, results in failure of the device.

DETAILED DESCRIPTION OF THE PREFERRED EMBODIMENTS

Figure 1:
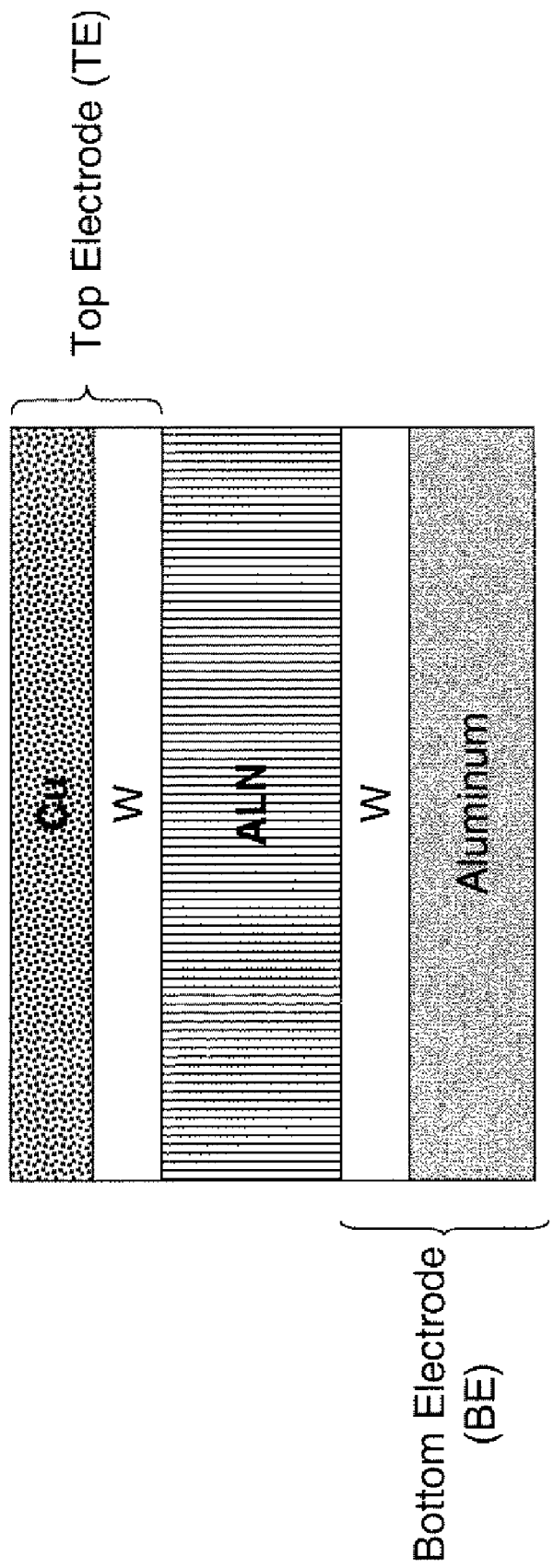
FIG. 1 illustrates a unique stack combining Al or an Aluminum alloy, Cu and W thin layers for electrodes of Bulk Acoustic Wave (BAW) resonator devices in accordance with the present invention.

In one aspect, the present invention comprises using a unique stack combining Al or an Aluminum alloy, Cu and W thin layers for electrodes of Bulk Acoustic Wave (BAW) resonator devices. This is illustrated in FIG. 1. The invention provides a better compromise at resonant frequencies from 1800 MHz to 4 GHz in terms of keff2 and resistance than state of the art solutions using either Mo, or a bilayer of Al and W.

The present invention also provides good integrability, in particular, fixing a problem related to via etch in AlN that pre-existed when using the state-of-the-art Al+W electrode.

Acoustic impedance is a material parameter that allows ranking of materials with respect to their acoustic qualities. Reported values in the literature for metal thin film of interest are the following:

W: $101 \times 10^6$ kg/m²s
Pt: $69.7 \times 10^6$ kg/m²s
Mo: $63.1 \times 10^6$ kg/m²s
Cu: $40.6 \times 10^6$ kg/m²s
Al: $17.3 \times 10^6$ kg/m²s
Au: $62.5 \times 10^6$ kg/m²s W, Pt, Mo and Al have been reported in the literature, along with more exotic Ru and Ir (at R&D level only) as candidate films to be used in BAW technology for electrode material.

Figure 2:
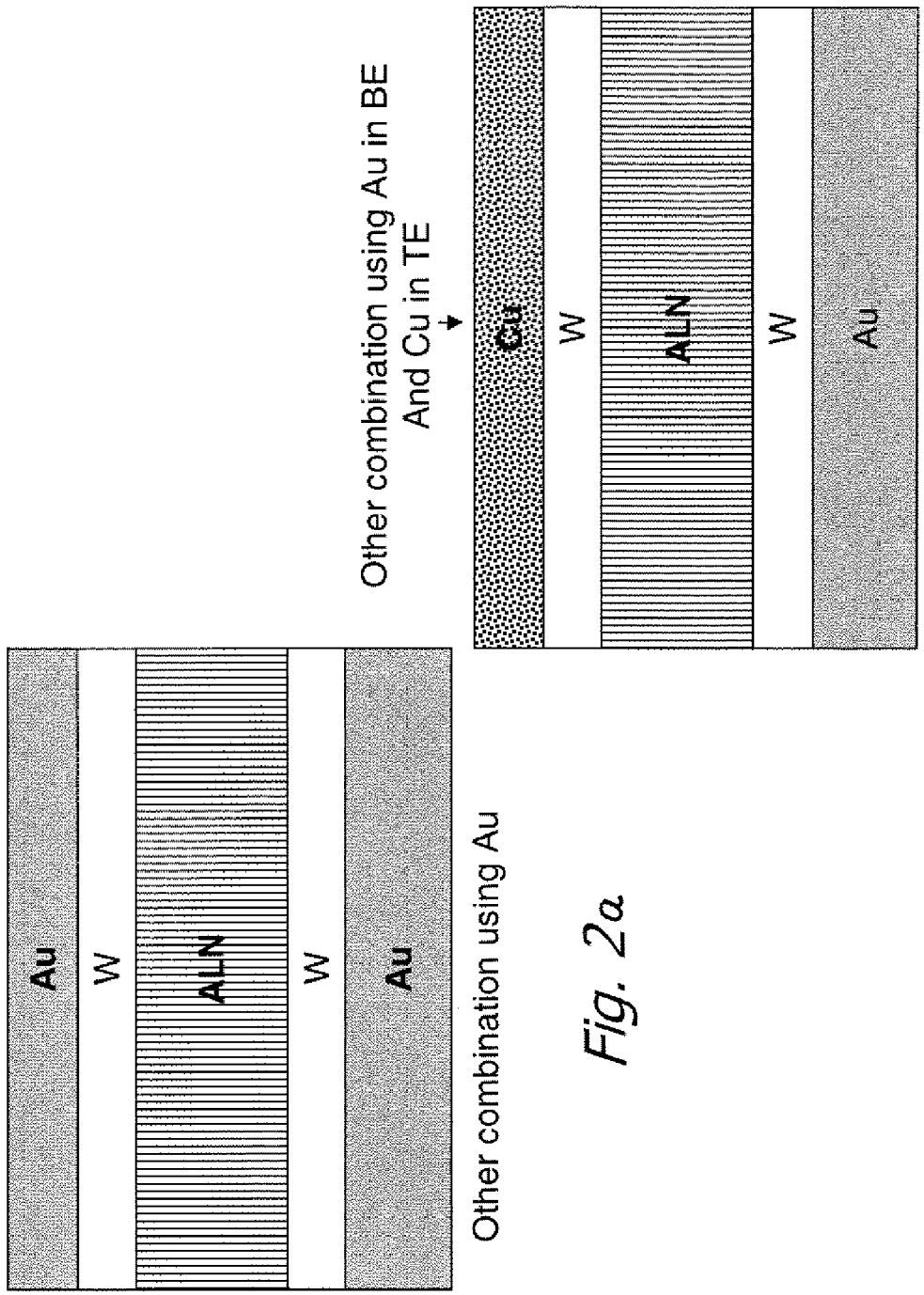
FIGS. 2a and 2b illustrate a combination of W and Cu, and W and Au, for electrodes of BAW resonator devices

In addition to acoustic properties, resistance is a main parameter to consider in order to select a film for electrodes. For those same films, literature values are:

W: $5 \times 10^{-8}$ Ω/m
Pt: $10.6 \times 10^{-8}$ Ω/m
Mo: $5 \times 10^{-8}$ Ω/m
Cu: $1.7 \times 10^{-8}$ Ω/m
Al: $2.65 \times 10^{-8}$ Ω/m
Au: $2.2 \times 10^{-8}$ Ω/m The concept of a bi-layer electrode is obvious for BAW resonators, when both acoustic and electric optimization at the same time need to be obtained. The choice of which materials to use is not. The present invention also comprises using a combination of W and Cu, or W and Au, as shown in FIGS. 2a and 2b. Looking at the material parameters above, it appears that:

Cu has better (higher) acoustic impedance than Al.
Cu has better (lower) resistivity than Al.
The combination of W and Cu is therefore what we used to achieve good keff2 and good Qs for BAW.
Au has better (higher) acoustic impedance than both Al and Cu.
Au has better (lower) resistivity than Al, but does not quite match Cu.
The combination of W and Au is therefore another valuable candidate for a stack for BAW electrode.

Figure 3:
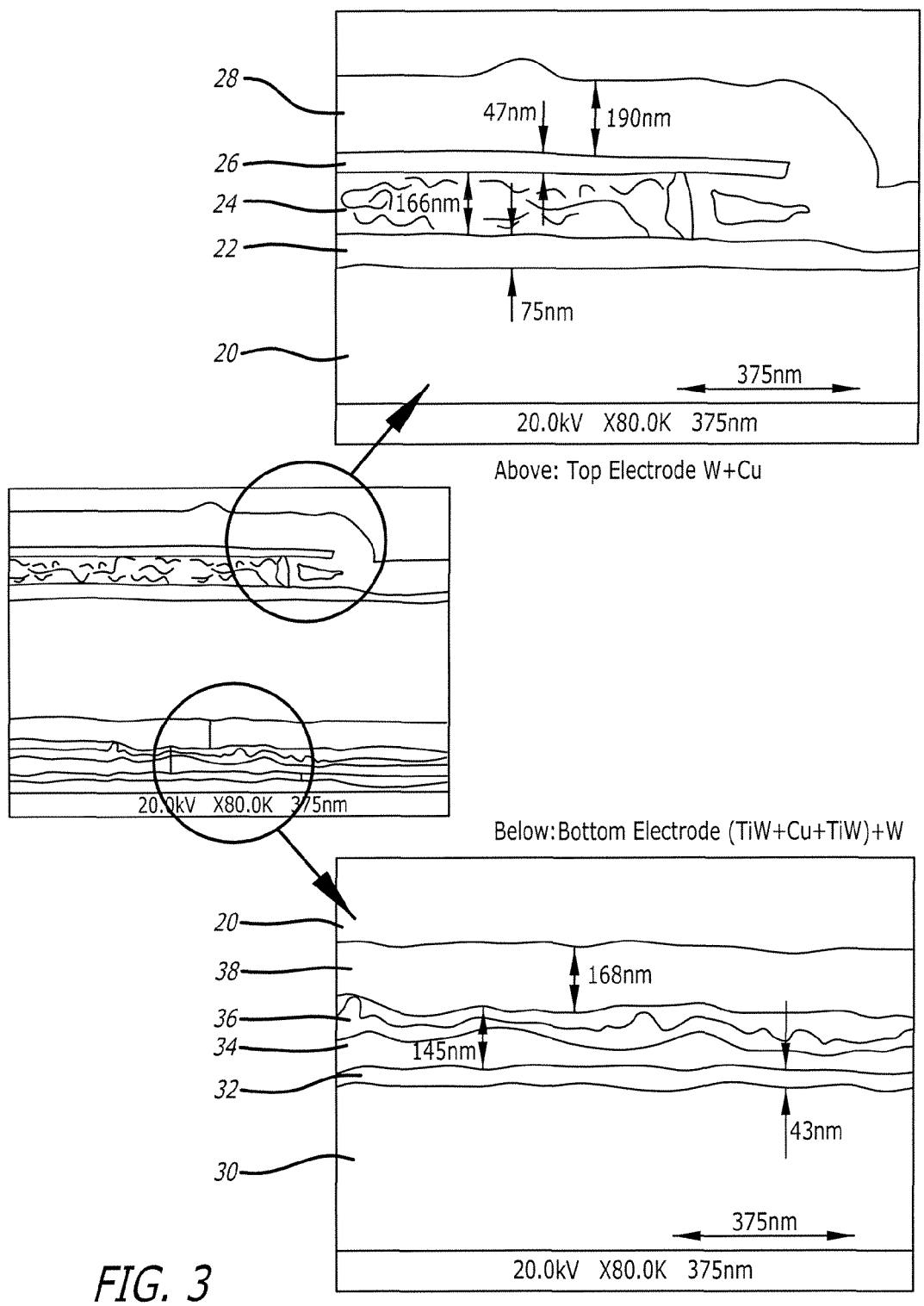
FIG. 3 is a cross section of a resonator incorporating the present invention.

One embodiment of the invention relates to a way to implement the integration of Cu in the bottom electrode. To do so, and keep a good resistance and a smooth film (required to grow subsequently a good quality MN), a multilayer is processed with a thin barrier layer, nominally 225 Å thick, below and above the Cu film to encapsulate and stabilize it. The barrier layer may be, by way of example, TiW, W, Ti, TiN, TaN or SiN, or a combination of the foregoing. FIG. 3 is a drawing of actual cross sections of the processed stack according to this embodiment of the invention.

In FIG. 3, a cross section of a resonator incorporating the present invention may be seen. At the left center, the full cross section may be seen, while the top right is the upper part of the cross section taken through the top electrode, and the bottom right is the lower part of the cross section taken through the bottom electrode. At the bottom is shown the substrate 30, a silicon oxide substrate, a TiW layer 32 approximately 43 nm thick, a copper layer 34 with a TiW layer 36 thereover, the combination approximately 145 nm thick, a W layer 38 approximately 168 nm thick, and then the AlN piezoelectric layer 20. Having a thin barrier, in this example TiW, encapsulating the copper layer helps stabilize it and keep a smooth bottom electrode.

At the top right, layer 20 is the AlN layer, layer 22 is a tungsten layer, approximately 75 nm thick, layer 24 is a copper layer approximately 166 nm thick, and then two silicon nitride layers 26 and 28, layer 26 being approximately 47 nm thick and layer 28, a passivation layer, being approximately 190 nm thick.

Another aspect of the present invention is to provide an electrode solution that is easy to integrate. With state-of-the art Al+W bottom electrodes, as stated before, subsequent via wet etch in AlN with, for instance, a TMAH solution, can result in the etchant reaching the Bottom Electrode Al through the W if the bottom electrode W layer happens to be porous. Because TMAH etches Al, the consequence is damage to the bottom electrode and failure of the device. However TMAH does not etch Cu. Therefore an AlN via etch in TMAH can be used.

Figure 4:
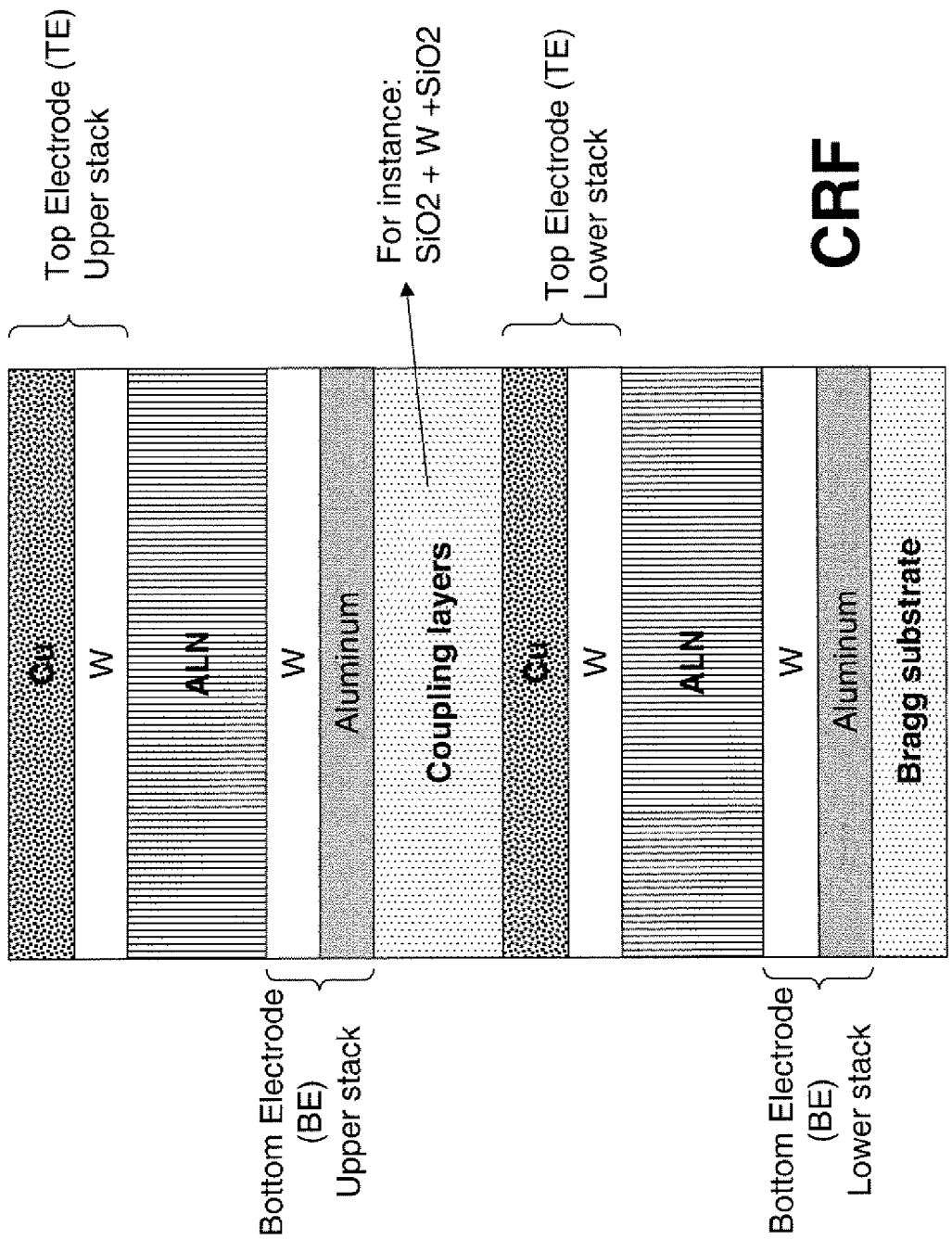
FIG. 4 illustrates the application of the present invention to coupled resonator filters.

A Coupled Resonator Filter (CRF) is a second generation BAW with 2 superimposed (mechanically coupled) active stacks, each encompassing bottom, top electrodes and an AlN film. The present invention is also applicable to coupled resonator filters, as illustrated in FIG. 4.

Figure 5:
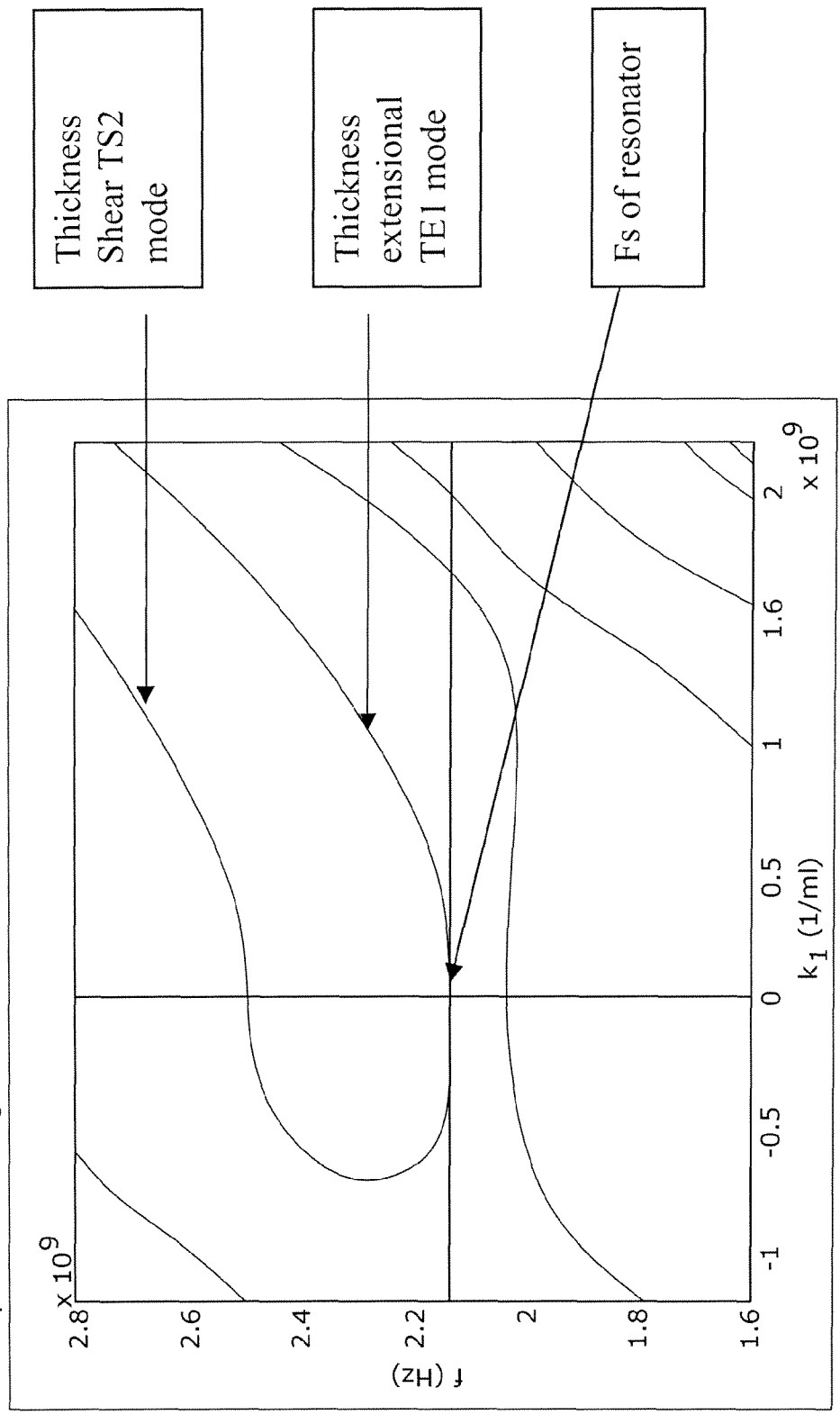
FIG. 5 is a typical dispersion curve plot for a solidly mounted BAW resonator.
Figure 6:
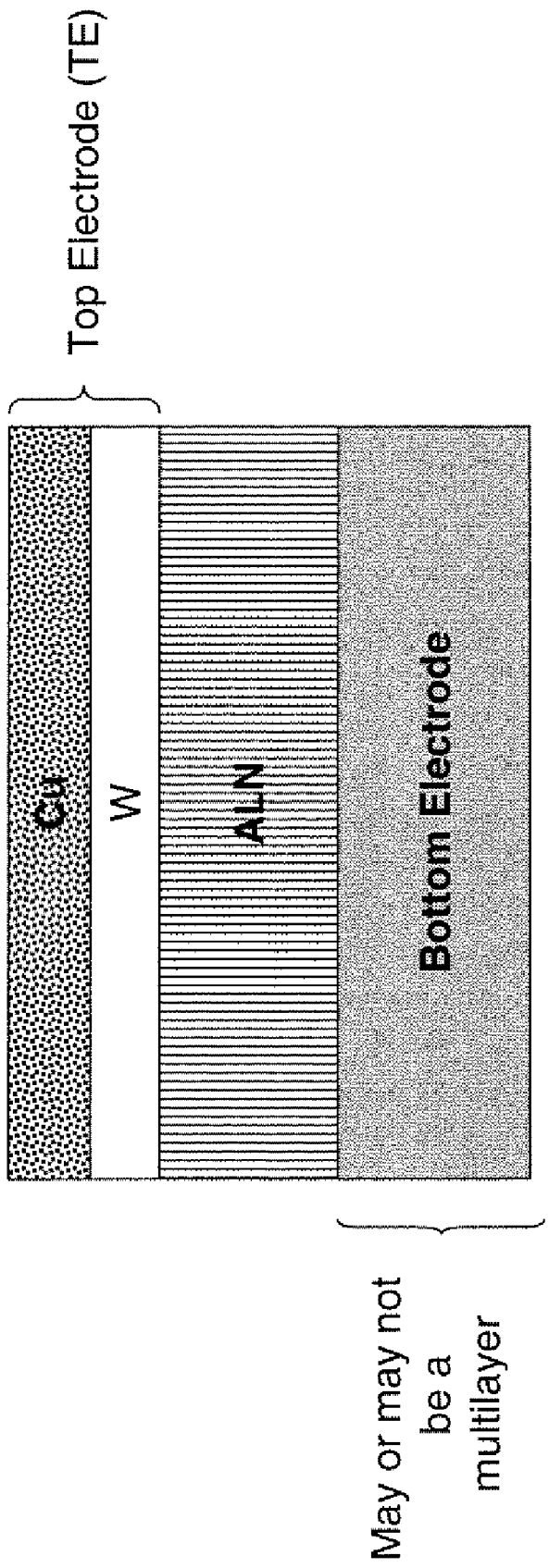
FIG. 6 illustrates an embodiment of this application and is therefore a BAW stack with Cu in the top electrode only, and a bottom electrode made of Mo, Au, Al, Al alloy or W, or a multilayer of a plurality of such materials.

A Solidly Mounted Resonator stack needs to show a Thickness Extensional mode branch in the dispersion curves plot (whose domain is wave number in abscissa, frequency in ordinate) favorable for spurious mode control (usually targeted with a positive slope, but qualitatively flat), as in FIG. 5. Depending on the application, it has been shown (for instance on a WCDMA duplexer) that integrating Cu in the bottom electrode might result in a Thickness Extensional mode branch slope steeper than desirable to control spurious modes. One embodiment of this application is therefore a stack with Cu in the top electrode only, and a bottom electrode made of Mo, Au, Al, Al alloy or W, or a multilayer of a plurality of such materials, as shown in FIG. 6. Depending on the choice of the bottom electrode, a dry etch process may need to be used for etching vias.

Thus the present invention has a number of aspects, which aspects may be practiced alone or in various combinations or sub-combinations, as desired. While preferred embodiments of the present invention have been disclosed and described herein for purposes of illustration and not for purposes of limitation, it will be understood by those skilled in the art that various changes in form and detail may be made therein without departing from the spirit and scope of the invention as defined by the full breadth of the following claims.

What is claimed is:

1. A bulk acoustic wave resonator comprising:
    a layer of piezoelectric material having a top and a bottom surface;
    a first electrode located above the top surface of the piezoelectric layer;
    a second electrode located below the bottom surface of the layer of piezoelectric material;
    at least one of the first and second electrodes including at least first and second layers of material, the first layer of material being selected from the group consisting of copper and gold, and the second layer of material being tungsten;
    wherein one electrode includes layers of copper and tungsten, and further comprised of a first barrier layer on a first side of the copper layer and a second barrier layer on a second side of the copper layer.

2. The bulk acoustic wave resonator of claim 1 wherein one electrode includes layers of copper and tungsten and one electrode includes layers of gold and tungsten.

3. The bulk acoustic wave resonator of claim 1 wherein one electrode includes an aluminum or aluminum alloy layer and a tungsten layer.

4. The bulk acoustic wave resonator of claim 1 wherein the first electrode includes copper and tungsten layers, and the second electrode includes a layer selected from the group consisting of Molybdenum, gold, aluminum, aluminum alloy and tungsten, or multiple layers of materials selected from the group.

5. The bulk acoustic wave resonator of claim 1 wherein both the first and second electrodes include at least first and second layers of material, the first layer of material being copper and the second layer of material being tungsten.

6. The bulk acoustic wave resonator of claim 1 wherein the resonate frequency of the bulk acoustic wave resonator is in a range from 1800 MHz to 4 GHz.

7. The bulk acoustic wave resonator of claim 1 wherein the barrier layers are selected from the group consisting of TiW, W, Ti, TiN, TaN, SiN or a combination of such layers.

8. The bulk acoustic wave resonator of claim 1 comprising a coupled resonator filter.

9. A bulk acoustic wave resonator comprising:
    a layer of piezoelectric material having a top and a bottom surface;
    a first electrode located above the top surface of the piezoelectric layer;
    a second electrode located below the bottom surface of the layer of piezoelectric material;
    at least one of the first and second electrodes including at least first and second layers of material, the first layer of material being selected from the group consisting of copper and gold, and the second layer of material being tungsten;
    wherein the second electrode includes the at least first and second layers of material, the first layer of material being copper and the second layer of material being tungsten, and further comprised of a first layer of titanium tungsten (TiW) on a first side of the copper layer and a second layer of TiW on a second side of the copper layer.

10. The bulk acoustic wave resonator of claim 9 wherein the first electrode is comprised of at least first and second layers of material, the first layer of material being copper and the second layer of material being tungsten.

11. A bulk acoustic wave resonator comprising:
    a layer of piezoelectric material having atop and a bottom surface;
    a first electrode located above the top surface of the piezoelectric layer;
    a second electrode located below the bottom surface of the layer of piezoelectric material;
    at least one of the first and second electrodes including at least first and second layers of material, the first layer of material being copper, and the second layer of material being tungsten,
    a first layer of titanium tungsten (TiW) on a first side of the copper layer and a second layer of TiW on a second side of the copper layer.

12. A bulk acoustic wave resonator comprising:
    a layer of aluminum nitride (AlN) having a top and a bottom surface;
    a first electrode located above the top surface of the AlN layer;
    a second electrode located below the bottom surface of the AlN layer;
    at least one of the first and second electrodes including at least first and second layers of material, the first layer of material being copper and the second layer of material being tungsten, a first layer of titanium tungsten (TiW) on a first side of the copper layer and a second layer of TiW on a second side of the copper layer.

13. A bulk acoustic wave resonator comprising:
a layer of aluminium nitride (AlN) having a top and a bottom surface;
a first electrode located above the top surface of the AlN layer;
a second electrode located below the bottom surface of the AlN layer;
at least one of the first and second electrodes including at least first and second layers of material, the first layer of material being copper and the second layer of material being tungsten,
a first barrier layer on a first side of the copper layer and a second barrier layer on a second side of the copper layer.

14. The bulk acoustic wave resonator of claim 13 wherein one electrode includes layers of gold and tungsten.

15. The bulk acoustic wave resonator of claim 13 wherein one electrode includes an aluminum or aluminum alloy layer and a tungsten layer.

16. The bulk acoustic wave resonator of claim 13 wherein one electrode includes a layer selected from the group consisting of Molybdenum, gold, aluminum, aluminum alloy and tungsten, or multiple layers of materials selected from the group.

17. The bulk acoustic wave resonator of claim 13 wherein both the first and second electrodes include at least first and second layers of material, the first layer of material being copper and the second layer of material being tungsten.

18. The bulk acoustic wave resonator of claim 13 wherein the resonate frequency of the bulk acoustic wave resonator is in a range from 1800 MHz to 4 GHz.

19. The bulk acoustic wave resonator of claim 13 wherein the barrier layers are selected from the group consisting of TiW, W, Ti, TiN, TaN, SiN or a combination of such layers.

20. The bulk acoustic wave resonator of claim 13 comprising a coupled resonator filter.

21. A bulk acoustic wave resonator comprising:
a layer of aluminum nitride (AlN) having a top and a bottom surface;
a first electrode located above the top surface of the AlN layer;
a second electrode located below the bottom surface of the AlN layer;
at least one of the first and second electrodes including at least first and second layers of material, the first layer of material being copper and the second layer of material being tungsten;
wherein the second electrode includes at least first and second layers of material, the first layer of material being copper and the second layer of material being tungsten, and further comprised of a first layer of titanium tungsten (TiW) on a first side of the copper layer and a second layer of TiW on a second side of the copper layer.

22. The bulk acoustic wave resonator of claim 21 wherein the first electrode is comprised of at least first and second layers of material, the first layer of material being copper and the second layer of material being tungsten.

* * * * *